US011535936B2

(12) United States Patent
Roberts et al.

(10) Patent No.: US 11,535,936 B2
(45) Date of Patent: Dec. 27, 2022

(54) DUAL GAS FEED SHOWERHEAD FOR DEPOSITION

(71) Applicant: Lam Research Corporation, Fremont, CA (US)

(72) Inventors: Michael Philip Roberts, Tigard, OR (US); Eric Russell Madsen, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 206 days.

(21) Appl. No.: 16/042,311

(22) Filed: Jul. 23, 2018

(65) Prior Publication Data
US 2020/0024739 A1    Jan. 23, 2020

(51) Int. Cl.
*C23C 16/455*    (2006.01)
*C23C 16/52*    (2006.01)

(52) U.S. Cl.
CPC ........ *C23C 16/45565* (2013.01); *C23C 16/52* (2013.01)

(58) Field of Classification Search
CPC .............. C23C 16/45565; C23C 16/52; C23C 16/45574; C23C 16/45563;
(Continued)

(56) References Cited

U.S. PATENT DOCUMENTS 6,132,512 A * 10/2000 Horie ................ C23C 16/45565
118/715
6,315,858 B1 * 11/2001 Shinozuka ................ C23F 3/00
156/345.39
(Continued)

OTHER PUBLICATIONS

Yu, Wei Sepehrnoori, Kamy. (2018). Shale Gas and Tight Oil Reservoir Simulation—3.3.2.1 Gas Diffusion. Elsevier. Retrieved from https://app.knovel.com/hotlink/pdf/id:kt011PWBTK/shale-gas-tight-oil-reservoir/gas-diffusion. (Year: 2018).*
(Continued)

*Primary Examiner* — Charlee J. C. Bennett
(74) *Attorney, Agent, or Firm* — Penilla IP, APC

(57) ABSTRACT

A showerhead utilized within a process chamber includes a first inlet for receiving a first gas from a first source at a center region of an inner plenum defined therein. A plurality of second inlets is defined along a peripheral region of the showerhead for receiving a second gas from a second source. A plurality of conduits couples the edge plenum to an outer edge of the inner plenum so as to supply the second gas to the inner plenum. The first gas creates an inner flow that flows radially outward from the center region to an outer edge of the inner plenum and the second gas supplied by the edge plenum creates a perimeter flow that flows inward from the outer edge of the inner plenum toward the center region. A stagnation point defining an adjustable radius is formed at an interface of the first gas and the second gas. A plurality of outlets are defined across a lower surface of the showerhead and extends a diameter of the inner plenum such that the first gas from the inner flow exits the plurality of outlets from the center region up to the stagnation point and the second gas from the perimeter flow exits the plurality of outlets from the stagnation point to the outer edge.

17 Claims, 7 Drawing Sheets

(58) Field of Classification Search
CPC ........ C23C 16/45559; C23C 16/45561; C23C 16/45529; C23C 16/45512
USPC ................. 118/715–733; 156/345.33–345.34
See application file for complete search history.

(56) References Cited

U.S. PATENT DOCUMENTS

| | | | |
|---|---|---|---|
| 6,548,419 B2 | 4/2003 | Heo et al. | |
| 8,066,895 B2 | 11/2011 | Belen et al. | |
| 9,460,893 B2 | 4/2016 | Kawamata et al. | |
| 9,466,506 B2 | 10/2016 | Masuda | |
| 9,758,868 B1* | 9/2017 | Breiling | C23C 16/4408 |
| 10,233,543 B2* | 3/2019 | Bansal | C23C 16/45565 |
| 10,287,683 B2* | 5/2019 | Xia | C23C 16/45519 |
| 2004/0216844 A1* | 11/2004 | Janakiraman | C23C 16/455 156/345.33 |
| 2005/0263072 A1* | 12/2005 | Balasubramanian | C23C 16/45574 438/758 |
| 2005/0279731 A1* | 12/2005 | Saito | H01L 21/67069 257/E21.252 |
| 2007/0181181 A1* | 8/2007 | Mizusawa | C23C 16/45574 438/5 |
| 2009/0000743 A1* | 1/2009 | Iizuka | H01J 37/32091 156/345.34 |
| 2014/0291286 A1* | 10/2014 | Okayama | H01J 37/3244 216/37 |
| 2015/0007770 A1* | 1/2015 | Chandrasekharan | C23C 16/45572 239/548 |
| 2015/0167168 A1* | 6/2015 | Keshavamurthy | C23C 16/45591 438/758 |
| 2016/0168705 A1* | 6/2016 | Lind | C23C 16/45574 239/548 |
| 2016/0340781 A1 | 11/2016 | Thomas et al. | |
| 2017/0002465 A1 | 1/2017 | Shaikh et al. | |
| 2017/0101712 A1* | 4/2017 | Bansal | C23C 16/45574 |
| 2017/0330728 A1 | 11/2017 | Bravo et al. | |

OTHER PUBLICATIONS

ISR, PCT/US2019/042444, dated Oct. 25, 2019, 3 pages.

* cited by examiner

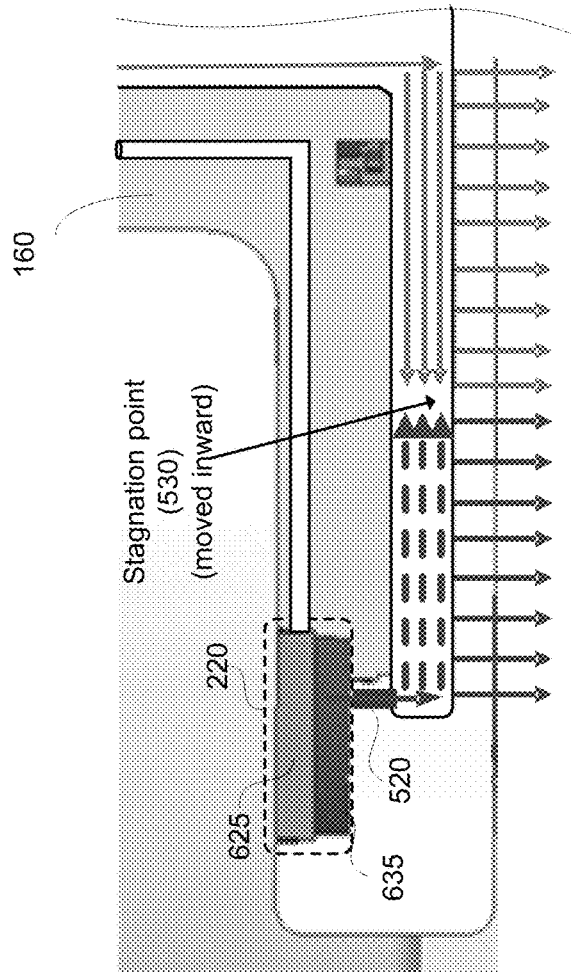
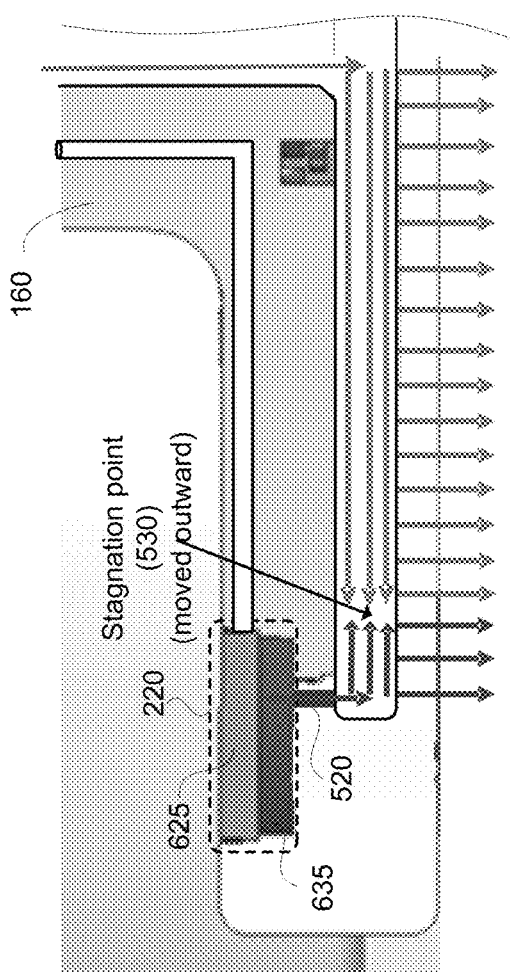
Figure 4A — Increasing gas flow from the edge plenum moves stagnation point inward, and vice versa - enabling radial control of effective size of each plenum
Figure 4B — Decreasing gas flow from the edge plenum moves stagnation point outward, and vice versa - enabling radial control of effective size of each plenum

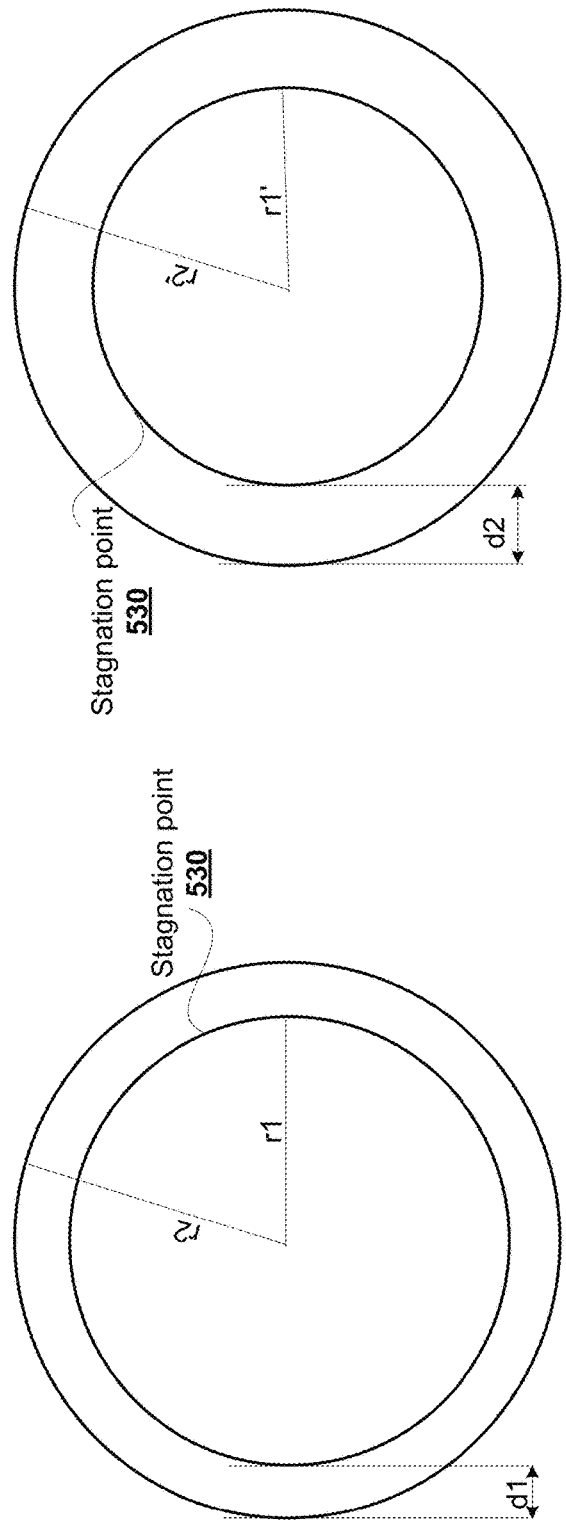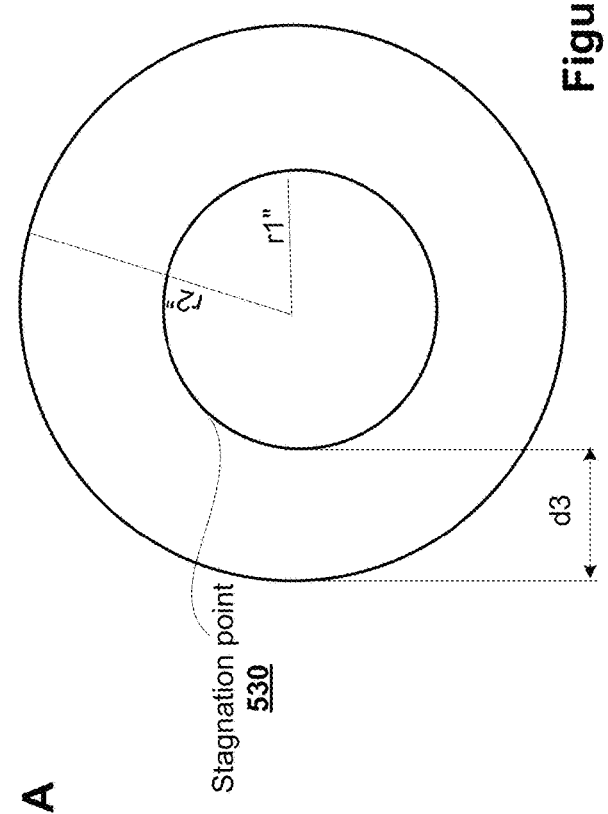

DUAL GAS FEED SHOWERHEAD FOR DEPOSITION

BACKGROUND

1. Field of the Disclosure

The present embodiments relate to semiconductor wafer processing equipment tools, and more particularly, to showerhead for providing different plenums of gases to the surface of a substrate.

2. Description of the Related Art

There are many types of film deposition processes commonly used in the semiconductor fabrication field. Some example deposition processes include atomic layer deposition (ALD) and plasma-enhanced chemical vapor deposition (PECVD). The ALD process uses plasma energy to deposit very thin films over the substrate surface. The ALD process includes a series of dosing and purging steps in which volatile gases or vapors are sequentially introduced over a heated substrate received in a process chamber, and purged. For example, a first precursor is introduced as a gas to allow the gas to be absorbed or adsorbed onto the substrate surface and the process chamber is cleared (i.e., purged) of the gaseous precursor. A second precursor is introduced as a gas, which reacts with the absorbed first precursor to form an atomic layer of the desired material. The process of introducing the first and second gaseous precursor and removal is repeated for a number of steps to define layer of specific thickness. By regulating this sequence by repeatedly switching the sequential flow of two or more reactive gases over the substrate, the films produced by ALD are deposited one atomic layer at a time.

In a PECVD process, a liquid precursor is converted into a vapor precursor and delivered to the process chamber. In order to provide the vapor precursor, PECVD systems may include a vaporizer that vaporizes the liquid precursor in a controlled manner to generate the vapor precursor.

Chambers used to process PECVD and ALD processes have employed a showerhead with plenums defined thereon for precision delivery of the different gaseous precursors so that the resulting films deposited on substrates are as uniform as possible and processes are repeatable from substrate-to-substrate. However, the plenums in the existing showerheads have been designed such that the effective radius of each plenum is fixed. The only way to change the radius is by swapping the showerhead. In other words, the application radius of the different gases cannot be modulated without swapping the showerhead.

It is in this context that embodiments of the current disclosure arise.

SUMMARY

Embodiments of the disclosure provide a showerhead design that can be used to modulate an effective radius of the gases applied on the top surface of a substrate. The showerhead is configured to open multiple process windows of different gases that can be radially tuned. The different gases may be of different composition or may be of same composition but with different concentrations. The showerhead is designed to provide flexibility in modulating size of the multiple process windows by dynamically adjusting radius of the different plenums. The flexibility is provided by connecting an edge plenum to an inner plenum internally within the showerhead, and controlling flow rate of the gases (e.g., gaseous precursors) to adjust the effective radii of the two gases delivered from the inner plenum and the edge plenum. The showerhead includes two inlets—a first inlet to receive a first gas from a first source into an inner plenum and a second inlet to receive a second gas from a second source through an edge plenum into the inner plenum while keeping the two gases sufficiently separate within the inner plenum. Sizes of the different process windows are controlled to radially tuning the gases, including tuning gas concentrations of the gases and dose delivery of the gases to different parts of the surface of the substrate, during deposition. By controlling the radial tuning of gas concentrations, the thickness of films formed on different areas of the substrate can be controlled.

In one implementation, a process chamber used for processing a substrate is disclosed. The process chamber includes a lower chamber body having a substrate support surface for supporting the substrate, when received in the process chamber, and an upper chamber body configured to mate over the lower chamber body. The upper chamber body includes a showerhead. The showerhead includes an inner plenum with a first inlet for receiving a first gas from a first source into a center region of the inner plenum so as to create an inner flow of the first gas that moves radially out from the center region toward an outer edge of the inner plenum. The showerhead also includes an edge plenum located along a peripheral region of the showerhead. The edge plenum includes one or more second inlets for receiving a second gas from a second source. A plurality of conduits couple the edge plenum to the inner plenum at the outer edge of the inner plenum. The plurality of conduits supply the second gas from the edge plenum into the inner plenum so as to create a perimeter flow of the second gas that flows inward from the outer edge of the inner plenum toward the center region. A stagnation point is defined within the inner plenum wherein the perimeter flow of the second gas interfaces with inner flow of the first gas. A plurality of outlets is distributed across a lower surface that extends a diameter of the inner plenum. The plurality of outlets is configured to deliver the first gas and the second gas from the inner plenum to the substrate support surface. The stagnation point defines an adjustable radius, wherein the inner flow of the first gas exits the plurality of outlets from the center up to the stagnation point and the perimeter flow of the second gas exits the plurality of outlets from the stagnation point toward the outer edge.

In some implementations, the adjustable radius is defined by adjusting flow of the second gas to the edge plenum or by adjusting flow of the first gas to the inner plenum or by adjusting flow of the first gas and the second gas.

In some implementations, the set of outlets includes a first sub-set of outlets defined in a center portion of the showerhead and extends up to the stagnation point, and a second sub-set of outlets defined along a peripheral region of the showerhead and extends from the stagnation point to the outer edge of the inner plenum. The first sub-set of outlets is configured to deliver the first gas from the inner flow to a central portion of the substrate support surface. The second sub-set of outlets is configured to deliver the second gas from the perimeter flow to an edge region of the substrate support surface.

In some implementations, a diameter of the inner plenum is equal to at least the diameter of the substrate received in the process chamber, such that the first sub-set of outlets covers the central region of the substrate and the second sub-set of outlets covers the edge region of the substrate, when the substrate is received in the process chamber.

In some implementations, the first inlet is located at a center of the showerhead and is coupled to the first source via a first flow valve, and the one or more second inlets is connected to a central channel defined in the showerhead. The central channel is defined to surround the first inlet and is coupled to the second source via a second flow valve.

In some implementations, the first inlet is located at a center of the showerhead and is coupled to the first source via a first flow valve and wherein a second inlet includes a plurality of second inlets that are located along a peripheral region of the showerhead. Each one of the plurality of second inlets is coupled to the second source via a distinct second flow valve located above the corresponding one of the plurality of second inlets. The first flow valve and each one of the plurality of second flow valves are coupled to a controller. The controller is configured to provide individual signals to the first flow valve to adjust a flow of the first gas into the inner plenum, and to each of the distinct second flow valves to adjust a flow of the second gas into the edge plenum.

In some implementations, the controller is configured to selectively provide signals to only the first flow valve to adjust the flow of the first gas into the inner plenum, to only the second flow valve to adjust the flow of the second gas into the edge plenum, or to both the first flow valve and the second flow valve to adjust the flows of the first gas into the inner plenum and the second gas into the edge plenum, so as to dynamically change the adjustable radius of the stagnation point defined within the inner plenum.

In some implementations, the process chamber includes a flow valve coupled to the one or more second inlets, the second source and to a controller. The controller is configured to provide a signal to the flow valve to control the perimeter flow of the second gas into the inner plenum in order to dynamically change the adjustable radius of the stagnation point defined within the inner plenum.

In some implementations, the process chamber includes a flow valve coupled to the first inlet, the first source and to a controller. The controller is configured to provide a signal to the flow valve to control flow of the first gas into the inner plenum through the first inlet. The adjustment to the flow of the first gas causes a dynamic change to the adjustable radius of the stagnation point defined within the inner plenum.

In some implementations, the edge plenum further includes a distribution plenum and an application plenum. The distribution plenum includes the one or more second inlets to receive the second gas provided by the second source and equalize the second gas. The application plenum includes a set of third inlets to receive the second gas from the distribution plenum and to supply the second gas through the plurality of conduits to an outer edge of the inner plenum.

In some implementations, a number of the second inlets in the edge plenum is less than a number of the plurality of conduits coupling the edge plenum to the inner plenum.

In another embodiment, a showerhead of a substrate processing system is disclosed. The showerhead includes an inner plenum having a first inlet for receiving a first gas from a first source into a center region of the inner plenum to create an inner flow of the first gas that moves radially out from the center region toward an outer edge of the inner plenum. The showerhead also includes an edge plenum that is located along a peripheral region of the showerhead. The edge plenum includes a plurality of second inlets for receiving a second gas from a second source. A plurality of conduits couple the edge plenum to the inner plenum at the outer edge of the inner plenum. The plurality of conduits supplies the second gas from the edge plenum to the inner plenum so as to create a perimeter flow of the second gas that flows inward from the outer edge toward the center region. A stagnation point is defined within the inner plenum where the perimeter flow of the second gas interfaces with inner flow of the first gas. A plurality of outlets is defined across a lower surface that extends a diameter of the inner plenum. The plurality of outlets is configured to deliver the first gas and the second gas from the inner plenum to a substrate, when the substrate is present in the substrate processing system. The stagnation point defines an adjustable radius where the inner flow of the first gas exits the plurality of outlets from the center region up to the stagnation point and the perimeter flow of the second gas exits the plurality of outlets from the stagnation point toward the outer edge.

The process chamber includes a controller, a first flow valve and a second flow valve. The first flow valve is connected to the first inlet, the first source and to the controller. The controller is configured to provide a signal to the first flow valve to adjust a flow of the first gas supplied from the first source through the first inlet into the inner plenum. The second flow valve is connected to each of the plurality of second inlets, the second source and to the controller. The controller is configured to provide a signal to the second flow valve to adjust a flow of the second gas from the second source through each of the plurality of second inlets into the edge plenum.

One advantage of providing a showerhead with multiple process windows by connecting the edge plenum to the inner plenum within the showerhead is that the radius of the process regions can be adjusted dynamically by adjusting a flow of the gases flowing from the inner plenum and/or the edge plenum. The radius can be dynamically adjusted by controlling the flow of the first gas into the inner flow of the inner plenum or controlling the second gas flowing into the perimeter flow of the inner plenum or controlling the both the first gas and the second gas flowing into the inner plenum. There is no need to switch the showerhead to cover different radii of gas application regions as the showerhead with the edge plenum connected internally to the inner plenum, allows dynamic variation to the application radius for the gases supplied to the substrate surface.

The traditional way of switching the showerhead involves lot of time and effort as it requires performing a sequence of operations. Some operations that needed to be performed include, breaking the vacuum in the process chamber, opening the process chamber, removing the existing showerhead, replacing the showerhead with a different showerhead with process windows that cover the required radii, closing the process chamber, and pumping the process chamber back to vacuum state before the showerhead can be operational.

The various embodiments described herein avoid such involved switching process by using a showerhead with dual plenum defined within so that the radii of the different gases applied to the process region over the substrate can be controlled by just adjusting the flow of one or both of the gases supplied to the inner plenum.

These and other advantages will be discussed below and will be appreciated by those skilled in the art upon reading the specification, drawings and the claims.

BRIEF DESCRIPTION OF THE DRAWINGS

FIGS. 4A and 4B illustrate example embodiments in which adjust a flow of second gas into the inner plenum causes a dynamic adjustment of the effective radii of the first gas and the second gas, in some implementations.

FIGS. 6A-6C shows an overhead view of an inner plenum defined in the showerhead showing the various radii of the first and second gas that can be achieved by adjusting flow of the first and/or the second gas, in accordance with an implementation.

DESCRIPTION

Figure 1:
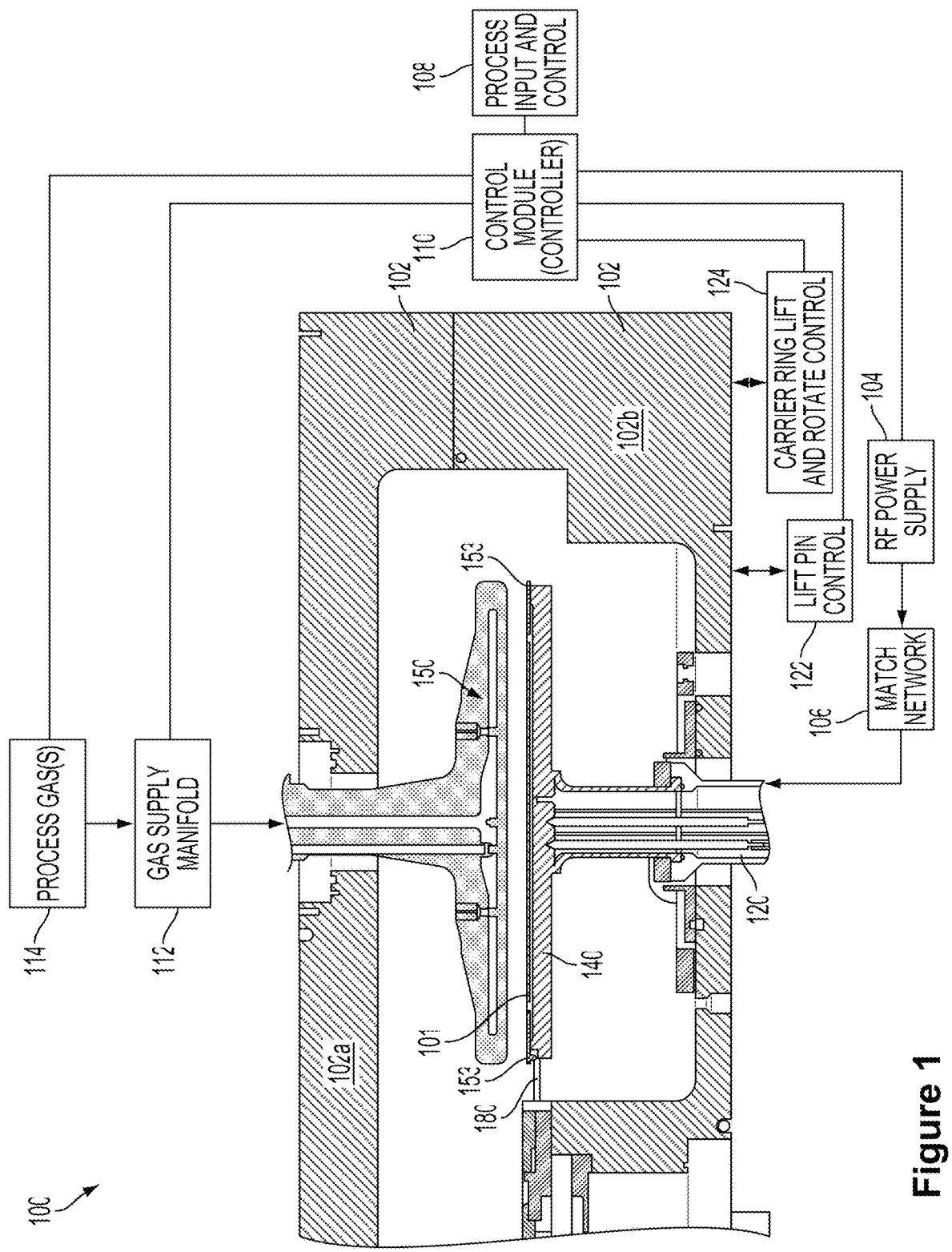
FIG. 1 illustrates an example substrate processing system with a process chamber that is used to process a substrate, in accordance with one embodiment.

Embodiments of the disclosure include a process chamber that is used for processing semiconductor substrates. The process chamber includes a showerhead to precisely deliver different gases to a top surface of a substrate received within the process chamber, in order to deposit uniform film layer on the top surface. The process chamber may be a single station process chamber or a multi-station process chamber. The showerhead is designed to include an inner plenum and an edge plenum. The edge plenum is connected to the inner plenum internally within the showerhead so as to define a single plenum with two process windows—a first window defined from the inner plenum for delivering a first gas and a second window defined from the edge plenum at an outer edge of the inner plenum, for delivering a second gas. The size of the two process windows can be dynamically adjusted at any time by adjusting flow of the gases (e.g., gaseous precursors) flowing into the inner plenum and/or to the edge plenum. The different gases delivered to the inner plenum and the edge plenum may be of a different composition or of difference concentration ratio. This dynamic adjustment to the sizes of the process windows provides the ability to control the thickness of film layer formed on different portions of the substrate surface.

Conventional showerheads were designed to deliver different gaseous precursors to the center (via an 'inner' plenum) versus the edge (via an 'edge' plenum) of the substrate. However, the design of the conventional showerhead was such that a plenum (i.e., inner plenum) supplying a first gas to the center area of the substrate and the plenum (i.e., edge plenum) supplying a second gas to the edge area of the substrate were kept distinct with a defined boundary separating the two plenums and separate sets of outlets defined at each of the inner plenum and the edge plenum of the showerhead to supply the first and second gases to treat different areas on the substrate surface, when the substrate is received in the process chamber. If there was a need to change a size of the areas covered by the inner plenum and the edge plenum, the showerhead that was used within the process chamber had to be swapped with a different showerhead that was designed to cover the adjusted size of the areas. Swapping of the showerhead would require breaking the vacuum of the chamber, replacing the existing showerhead with the new showerhead, and vacuum sealing the chamber before the chamber can be used, which is both time consuming and labor intensive.

In order to overcome the limitations of the conventional showerhead design, a new showerhead design is disclosed wherein the showerhead includes separate inner plenum and edge plenum to receive two different gases, and the edge plenum is connected to the inner plenum from inside the showerhead. In the new design of the showerhead, an existing direct path from the edge plenum to process chamber is no longer available. Instead, a new connection is defined between the edge plenum and the inner plenum within the showerhead. The new connection includes a plurality of conduits that are provided proximal to an outer edge of the inner plenum. The new design allows a single contiguous plenum to be formed within the showerhead with a stagnation point defined at an interface separating the gases.

The inner plenum is formed in a central portion of the showerhead and the edge plenum is formed at a peripheral portion of the showerhead. The gas from the edge plenum is supplied to an outer edge of the inner plenum by the plurality of conduits. A set of outlets formed across a lower surface of the showerhead allows for the different gases from the inner plenum to be applied to different areas of the substrate surface. Adjusting a flow of the gases received in the inner plenum results in the dynamic adjustment to the radii of the different gases in the inner plenum, and, as a result, a location of the stagnation point separating the gases in the inner plenum. The new showerhead design provides an efficient way of dynamically controlling sizes of the treatment windows of the different gases that are used to treat different areas of the substrate.

It should be appreciated that the present embodiments can be implemented in numerous ways, such as a process, an apparatus, a system, a device, or a method. Several embodiments are described below.

FIG. 1 illustrates an example substrate processing system 100, which is used to process a substrate 101, in one implementation. The system includes a process chamber having a lower chamber body 102*b* and an upper chamber body 102*a*. A center column is defined in the lower chamber body 102*b* and is configured to support a pedestal 140, which in one embodiment is a powered electrode. The pedestal 140 provides a substrate support surface on which a substrate, for processing, is received. The pedestal 140 is electrically coupled to power supply 104 via a match network 106. The power supply is controlled by a control module 1000, e.g., a controller. The control module 1000 is configured to operate the substrate processing system 100 by executing process input and control 108. The process input and control 108 may include process recipes, such as power levels, timing parameters, process gases (e.g., precursors), flow rates of the process gases, mechanical movement of the substrate 101, pressure, temperature within the process chamber, etc., so as to deposit or form films over the substrate 101 via ALD methods or PECVD methods.

The center column is also shown to include lift pins 120, which are controlled by lift pin control 122. The lift pins 120 are used to raise the substrate 101 from the pedestal 140 to allow an end-effector to pick the substrate and to lower the substrate 101 after being placed by the end end-effector. The substrate processing system 100 further includes a gas supply manifold 112 that is connected to process gas source 114, e.g., gas supplies from a facility. Depending on the processing being performed, the control module 1000 controls the delivery of process gases 114 into the showerhead 150 via the gas supply manifold 112. The process gases are then distributed to a process region defined by a space volume between the showerhead 150 face that faces the substrate 101 and the substrate 101 received on the pedestal 140. The process gases are provided in process windows that are controlled by controlling flow of the process gases into an inner plenum and/or edge plenum defined in the showerhead.

Further, the gases may be premixed or not. Appropriate valving and mass flow control (MFC) mechanisms may be employed to ensure that the correct gases are delivered during the deposition and plasma treatment phases of the process. Process gases exit chamber via an outlet (not shown). A vacuum pump (not shown) (e.g., a one or two stage mechanical dry pump and/or a turbo-molecular pump) draws process gases out and maintains a suitably low pressure within the process chamber by a close loop controlled flow restriction device, such as a throttle valve or a pendulum valve.

The substrate processing system 100 further includes a carrier ring 153 that encircles an outer region of the pedestal 140. The carrier ring 153 is configured to sit over a carrier ring support region that is a step down from a substrate support region in the center of the pedestal 140. The carrier ring 153 includes an outer edge side of its disk structure, e.g., outer radius, and a substrate edge side of its disk structure, e.g., inner radius, that is closest to where the substrate 101 sits. The substrate edge side of the carrier ring 153 includes a plurality of contact support structures which are configured to lift the substrate 101 when the carrier ring 153 is lifted by forks 180. Movement of the carrier ring 153 is controlled by the carrier ring lift and rotate control 124 through signals provided by the controller 110 to which the carrier ring lift and rotate control 124 is coupled. For example, the carrier ring lift and rotate control 124 may be employed to lift the carrier ring 153 along with the substrate 101 and moved into or out of the process chamber, e.g., in a single-station system. Alternately, the carrier ring lift and rotate control 124 may be employed to rotate the carrier ring 153 with the substrate 101 to another station, e.g., in a multi-station system.

RF power is supplied to an electrode of the chamber (e.g., pedestal 140 in the lower chamber portion 102b, which is the powered electrode) so that plasma can be generated for deposition. In alternate implementations, the plasma may be remotely generated and supplied to the process chamber through the showerhead. In yet other implementations, the upper chamber portion may be a powered electrode and the lower chamber portion (i.e., pedestal 140) may be grounded. In such implementations, the RF power is supplied to the powered electrode for generating plasma.

A conventional showerhead that was used in providing separate delivery plenums of gases to different portions of the substrate surface during a deposition process included an inner plenum that was defined separate from the edge plenum. The inner plenum provided a first gas from a first source directly into the process chamber so as to cover a central portion of the surface of the substrate received within the process chamber. The edge plenum provided a second gas from a second source directly into the process chamber so as to cover an edge portion of the substrate surface. The radii of the inner plenum and the edge plenum were fixed. As a result, the area covered by the first gas from the inner plenum and the second gas from the edge plenum each covered a fixed radius on the surface of the substrate. With this showerhead design, the radii of the inner and edge plenums cannot be modulated without swapping the showerhead.

In an alternate conventional design of a showerhead, the showerhead used distinct inner plenum and edge plenum. The positioning of the outlets on the bottom surface of the showerhead resulted in the gas from the inner plenum to be applied to the process chamber so as to extend a certain radius of the showerhead, and the edge plenum overlapped with an edge portion of the inner plenum. As a result, when this showerhead was used for applying the gases to the surface of the substrate, an edge portion of the substrate surface was exposed to a mixture of gases from the inner plenum and the edge plenum while a central portion of the substrate surface was exposed to the first gas of the inner plenum. The widths of the mixed gases applied at the edge portion and the first gas of the inner plenum applied at the central portion of the substrate surface were fixed and could not be modulated. Any change to the application width could only be accomplished by changing one showerhead with a different showerhead that was designed for the specific application width.

For example, one conventional showerhead included distinctly fixed process windows with a first process window, defined from the inner plenum, that covered an area with effective radius of about 147 mm and a second process window, defined from the edge plenum, that covered an area with effective ring radius of between about 152 mm and about 163 mm radius with no outlets defined between the first process window and the second process window (i.e., between about 147 mm and about 152 mm). In order to cover different sized process windows, a number of showerheads with different sized process windows were designed. For example, a second conventional showerhead was designed to include a first process window that covered an area with effective radius of about 140 mm and a second process window that covered an effective ring radius of between about 145 mm to about 163 mm with no outlets defined between the first and the second process windows (i.e., between about 140 mm and about 145 mm). Similarly, a third conventional showerhead included a first process window that covered an area with effective radius of about 125 mm and a second process window that covered an effective ring radius of between about 130 to about 163 mm with no outlets defined between the first and the second process windows (i.e., between about 125 mm and about 130 mm). The above three example showerheads were used to surface treat a substrate that had an effective radius of about 150 mm Other showerheads were designed to provide different coverage areas for the inner plenum and the edge plenum. So, when specific treatment windows were desired, a specific showerhead that covered the desired treatment windows was selected and used, as the size of the different plenums were fixed and could not be modulated.

Figure 2A:
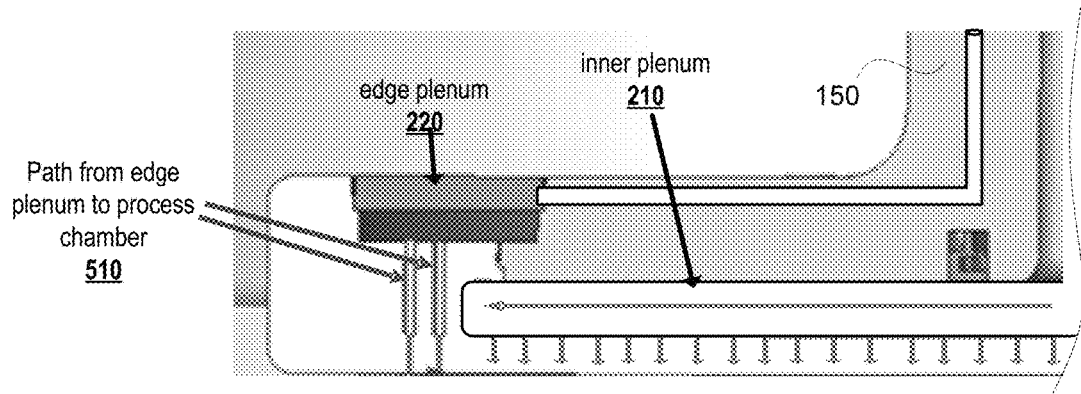
FIGS. 2A-2C illustrate a schematic view of re-designing a showerhead in which the edge plenum is connected to an inner plenum, in accordance with one embodiment.
Figure 2B:
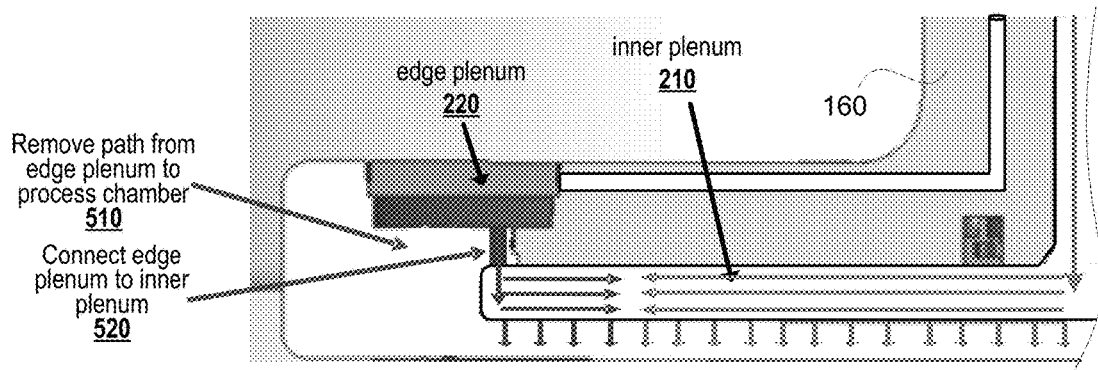
Figure 2C:
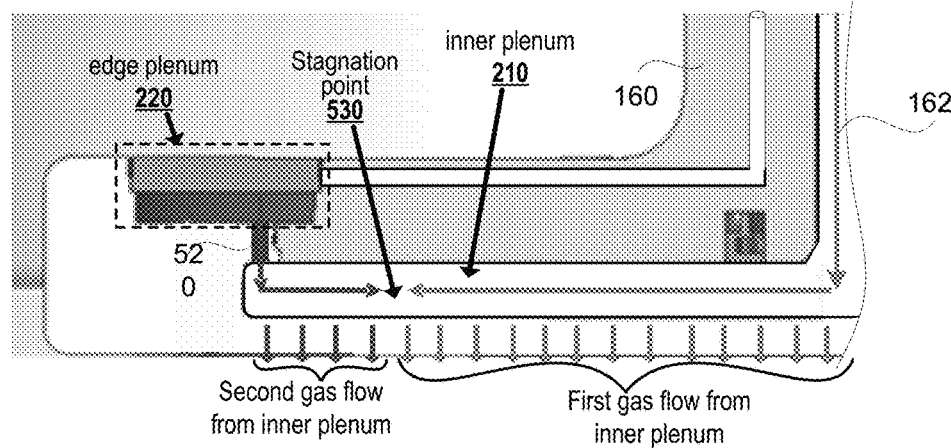

FIGS. 2A-2C illustrate a step-wise structural changes that were needed to re-design a conventional showerhead to accomplish the inventive features of the current disclosure. FIG. 2A illustrates a schematic representation of a partial view of an existing conventional showerhead 150. The showerhead 150 includes distinctly separate delivery plenums—e.g., an inner plenum 210 defined in the center portion of the showerhead 150 and an edge plenum 220 defined proximal to an outer periphery of the showerhead 150. A first inlet defined at the center of the showerhead, is coupled to a first source for delivering a first gas to the inner plenum 210. One or more second inlets are defined at the edge plenum 220 and are configured to receive a second gas from a second source. The showerhead 150 design includes a first set of outlets defined across a lower surface for supplying the first gas from the inner plenum of the showerhead into a processing region defined in the process chamber between a lower surface of the showerhead and a top surface of the substrate support system (e.g., pedestal). A second set of outlets are defined at the edge plenum to provide a direct path 510 for the second gas from the edge plenum 220 to the processing region.

FIG. 2B illustrates the change to the structure of the showerhead 150 to define a re-designed showerhead 160 that includes the edge plenum being coupled to the inner plenum within the showerhead through a set of conduits. This coupling allows for dynamic modulation of the radii defining the different process windows that supply the first and second gases. The change to the existing showerhead structure includes removing the second set of outlets that provide the direct path 510 from the edge plenum 220 to the processing region. In place of the second set of outlets, one or more conduits 520 are defined to couple the edge plenum 220 to the inner plenum 210 so as to connect the edge plenum 220 to an outer edge of the inner plenum 210 within the showerhead. The one or more conduits are defined to allow the second gas from the edge plenum to be supplied to the outer edge of the inner plenum 210. The second gas supplied from the edge plenum 220 extends outward from the outer edge of the first gas for a second radius.

FIG. 2C illustrates the re-designed showerhead 160 with the one or more conduits 520 connecting the edge plenum 220 to the outer edge of the inner plenum 210 inside of the showerhead 160. The location of the conduits 520 at the edge of inner plenum creates a perimeter flow of the second gas received from a second source (not shown). A first gas is received from a first source (not shown) through a first inlet 162 defined at a center of the showerhead 160. The introduction of the first gas creates an inner flow of the first gas inside the inner plenum. The inner flow moves from the center region radially out toward an outer edge of the inner plenum. The conduit 520 allows the second gas to flow through from the edge plenum 220 to an outer edge of the inner plenum 210. The flow of the second gas creates a perimeter flow that flows inward from the outer edge toward the center region of the inner plenum. The perimeter flow allows the second gas to interface with the first gas flowing from the inner flow at a stagnation point within the inner plenum. The stagnation point defines an adjustable radius that can be controlled by adjusting flow of the first gas, the second gas or both of the first and second gases.

FIG. 2C illustrates a location of the meeting point (i.e., stagnation point 530) at a central radius where the first gas of the inner plenum (represented by the blue lines) meets the second gas of the edge plenum (represented by the red lines and arrows) flowing through the one or more conduits 520. A plurality of outlets in the lower surface of the showerhead 160 facing the pedestal allows the first and second gases from the inner plenum to be applied to a top surface of the substrate (shown by blue arrows and red arrows), when the substrate is received on the pedestal within the process chamber. The gas inside of the stagnation point radius is largely the first gas from the inner flow and the gas outside of the stagnation point radius is largely the second gas from the perimeter flow. As a result, the first gas from the inner flow exits a first set of outlets defined in the center of the showerhead and the second gas from the perimeter flow exits a second set of outlets defined in the peripheral region of the showerhead. By combining the two gases in the inner plenum prior to supplying the gases to the process chamber, it is easier to modulate the effective radii of the two gases (i.e., sizes of the different process windows) applied to different areas on the substrate surface. The re-designed showerhead 160 allows radial tuning of different gases supplied to the different plenums (i.e., adjusting a size of the multiple windows) by adjusting flow of any one or both of the gases.

Figure 3:
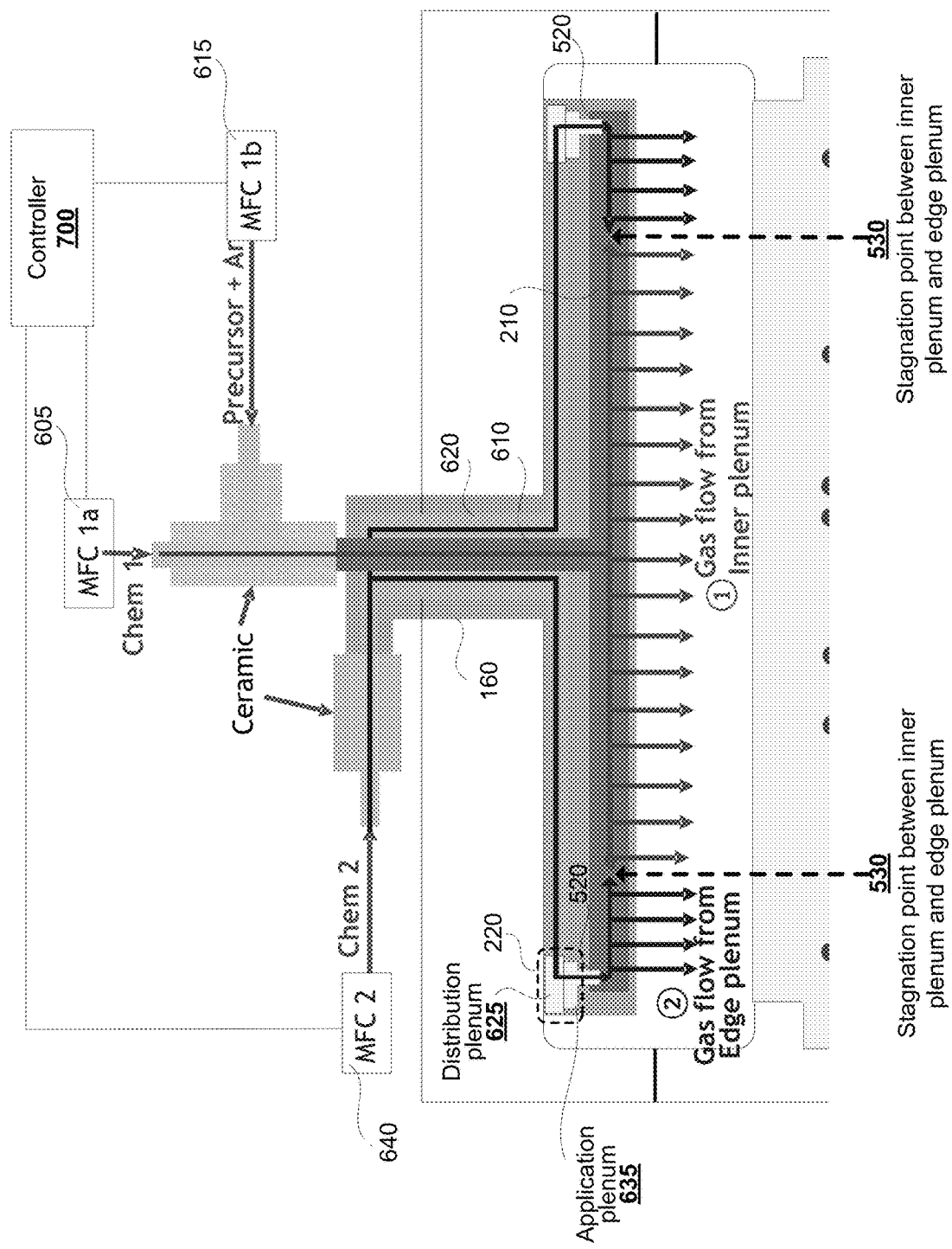
FIG. 3 illustrates a schematic view of a substrate processing system in which the re-designed showerhead is used, in accordance with one embodiment.

FIG. 3 shows a schematic view of the re-designed showerhead 160 with the dual plenum defined inside an inner plenum of the showerhead, in one implementation. The showerhead 160, in this implementation includes a first inlet 610 defined in a center of the showerhead 160 to receive first gas (e.g., Chem 1) from a first source (not shown). The first inlet 610 is connected to the first source through a first flow valve 605 (e.g., multi-flow control flow valve or MFC 1a). The first flow valve 605 controls flow of the first gas into the inner plenum. The first flow valve 605, MFC 1a, in turn, is connected to a controller 700 (similar to controller 110 of FIG. 1) that provides a signal to the first flow valve 605, MFC 1a, to control the flow rate of the first gas through the first inlet 610. The first inlet 610 supplies the first gas from the first source to the inner plenum 210, where the first gas is equalized prior to being applied to a top surface of a substrate through a set of outlets. As part of the equalization, the first gas creates an inner flow that flows from the center of the showerhead radially outward toward an outer edge of the inner plenum 210. In addition to the first gas, a precursor chemistry may also be provided through the first inlet 610, wherein the first inlet 610 is connected to a precursor source (not shown) through a third flow valve 615 MFC 1b. The precursor chemistry may be a mixture of a gas mixed in inert gas, such as Argon, wherein the gas may be the first gas or any other gas that provides the precursor functionality. The precursor chemistry may be provided after purging the first gas from the process chamber. The third flow valve 615 is connected to the controller 700, which provides a signal to control flow of the precursor chemistry into the process chamber through the inner plenum. The precursor chemistry may be applied for a pre-defined period of time and then purged.

The showerhead 160 also includes an edge plenum 220 defined along a peripheral region of the showerhead 160 to receive a second gas (e.g., Chem 2) from a second source (not shown). The edge plenum, in the implementation illustrated in FIG. 3, receives the second gas from the second source through a central channel 620 defined in the showerhead 160. The central channel 620 is connected to the second source via a second flow valve 640 (e.g., MFC 2). The second flow valve 640, in turn, is connected to the controller 700 to control the flow rate of the second gas to the edge plenum 220. The central channel 620 surrounds the first inlet 610. The second gas is supplied to the edge plenum at about the same time the first gas is supplied to the inner plenum so that the radii of the two gases can be adjusted by adjusting the respective flow rates of the two gases.

In the implementation illustrated in FIG. 3, the edge plenum 220 includes a distribution plenum 625 and an application plenum 635. The distribution plenum 625 receives the second gas supplied from the second source and equalizes the second gas. The equalized second gas is then supplied to the outer edge of the inner plenum 210 via the application plenum 635 and a plurality of conduits 520. The flow rate of the first and/or the second gases is controlled so as to control the radii of the first, the second gases in the inner plenum thereby adjusting the radius of the stagnation point defined at the interface of the two gases in the inner plenum. For example, increasing the flow of the second gas from the edge plenum while keeping the flow of the first gas constant moves the stagnation point inward and vice versa.

FIGS. 4A-4B illustrate the effect of adjusting the flow of the second gas from the edge plenum on the radii of the first and the second gases in the inner plenum. In one implementation illustrated in FIG. 4A, when the flow of the second gas supplied to the inner plenum through the edge plenum is greater than the flow of the first gas supplied to the inner plenum, the effective size of the second gas plenum within the inner plenum increases with a corresponding decrease in the effective size of the first gas plenum in the inner plenum. As a result, the stagnation point 530 moves inward toward the center of the showerhead thereby reducing the radius of the stagnation point 530 defined at the interface of the inner and perimeter gas flows of the first and second gases, respectively. Similarly, when the flow of the second gas supplied to the inner plenum through the edge plenum is smaller than the flow of the first gas into the inner plenum, the effective size of the second gas plenum decreases and the effective size of the first gas plenum increases within the inner plenum, as illustrated in FIG. 4B. As a result, the stagnation point 530 moves outward, thereby increasing the radius of the stagnation point 530.

In an alternate implementation, instead of adjusting the flow of the second gas from the edge plenum, the flow of the first gas may be controlled in order to adjust the effective size of the first and second gas plenums within the inner plenum. For example, decreasing the flow rate of the first gas causes the stagnation point 530 to move inward due to an increase in the effective size of the second gas plenum within the inner plenum and a decrease in the effective size of the first gas. This is due to a higher flow rate of the second gas in relation to the flow rate of the first gas. In yet other implementation, the flow rate of both the first and the second gases may be adjusted to increase or decrease the effective size of the respective plenums within the inner plenum thereby controlling the effective radial size of each plenum. It should be noted that some portion of the first and the second gases will mix near the stagnation point. This mixing of the two gases results in a smooth but continuous transition of concentration in the two gases over the substrate.

Figure 5A:
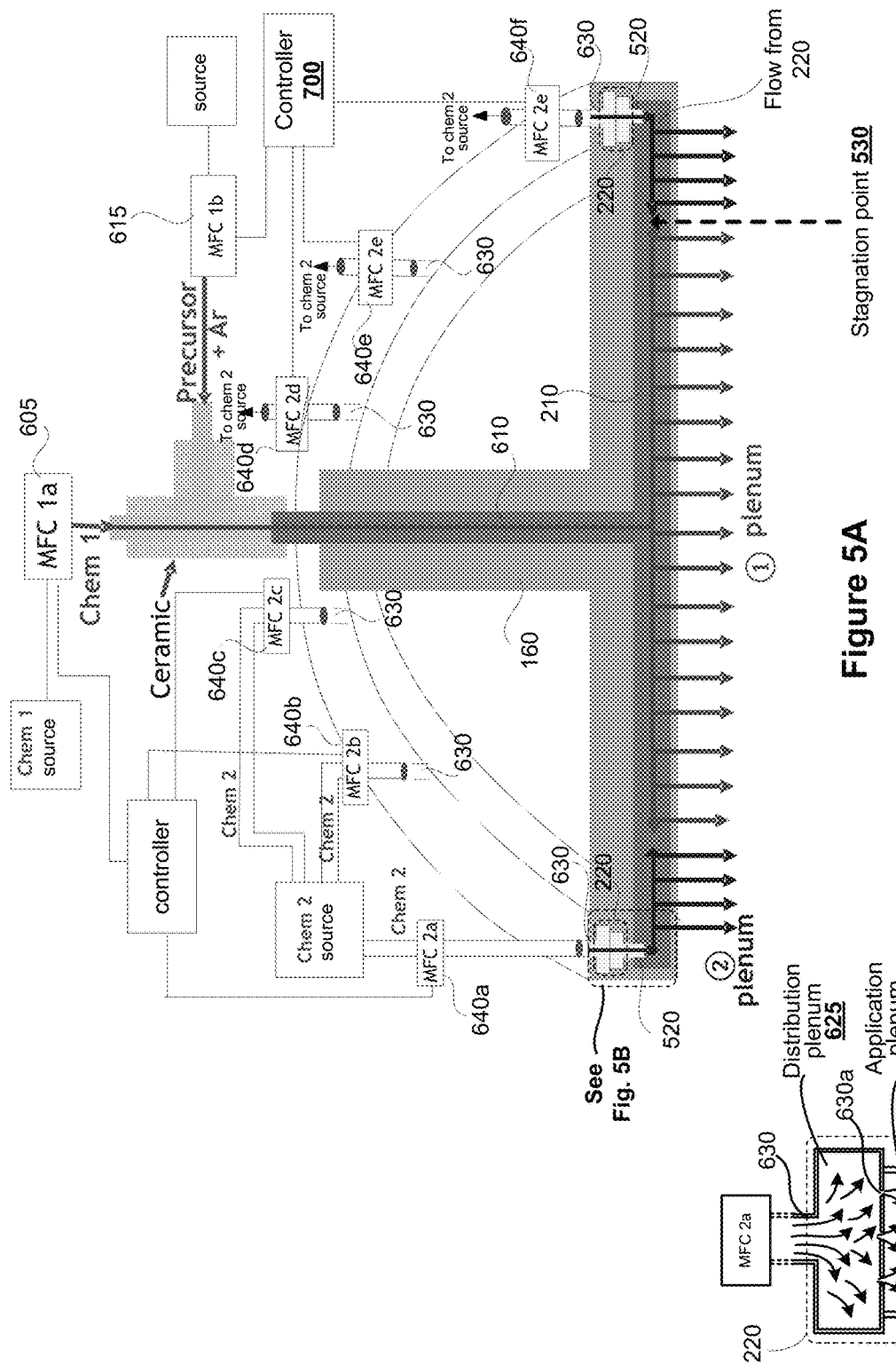
FIG. 5A illustrates an example showerhead that includes a plurality of gas flow valves to control flow of the second gas into the edge plenum, in some implementation.

FIG. 5A illustrates an alternate design of a showerhead 160 described with reference to FIG. 3, in one implementation. In this implementation, a first inlet 610 is defined at the center of the showerhead and a plurality of second inlets 630 is defined over a top surface of the distribution plenum defined along a peripheral portion of the showerhead. The first inlet 610 is connected to a first source through a first flow valve MFC 1a, which is connected to a controller 700. The controller 700 provides a signal to the first flow valve to adjust the flow of the first gas to the center of the inner plenum to cause an inner flow of the first gas. The inner flow causes the first gas to flow outward toward the periphery of the showerhead. Each of the set of second inlets 630 is connected to a second source (i.e., Chem 2 source) through a corresponding second flow valve. FIG. 5A shows a simplified cross section of the showerhead 160 with the multiple second flow valves (MFC 2a-2f shown in FIG. 5A) distributed uniformly along a peripheral region of the showerhead and connected to a single second source (e.g., Chem 2 source).

In FIG. 5A, about 10 second flow valves are distributed uniformly along a periphery region of the showerhead 160. In alternate implementations, two, four, eight or more second flow valves may be distributed uniformly along the periphery region of the showerhead to control the flow of the second gas into the edge plenum. In alternate implementations, the plurality of second inlets 630 is connected to a second source through a single second flow valve. In the implementation illustrated in FIG. 5A, the second flow valves are disposed outside the showerhead above the corresponding one of the plurality of second inlets 630. In alternate implementations, the second flow valves may be disposed inside the showerhead below the corresponding one of the set of second inlets 630. In the implementation illustrated in FIG. 5A, the second flow valves are connected to a single second source. In alternate implementations, more than one second source may be engaged to provide the second gas to the edge plenum and one or more of the second flow valves are connected to distinct one of the second source via corresponding second flow valves. Irrespective of the number of second flow valves, each one of the second flow valves is connected to a controller 700 and the controller is configured to provide signals to selective ones or all of the second flow valves to control the flow of the second gas into the edge plenum.

Figure 5B:
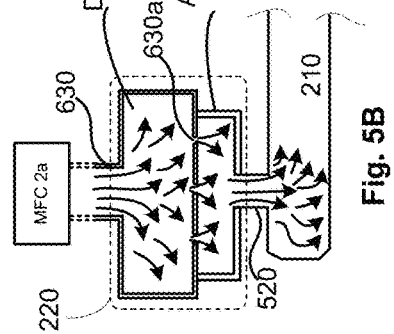
FIG. 5B illustrates a vertical cross-sectional view of a portion of the showerhead depicting the distribution plenum and the application plenum within the edge plenum of the showerhead, in some implementation.

FIG. 5B illustrates an expanded cross-sectional view of a portion of the showerhead that defines the edge plenum 220. The edge plenum is coupled to the second flow valve, MFC2A, through a plurality of second inlets 630. The second gas flows from the second source and through the plurality of second inlets 630 to the distribution plenum 625 and the flow is controlled by the one or more second flow valves. The second gas gets equalized within the distribution plenum 625 before exiting out to the application plenum 635 through a third set of inlets 630a defined between the distribution plenum 625 and the application plenum 635. The third set of inlets 630a are defined such that each one of the third set of inlets 630a is offset from a conduit 520 defined between the edge plenum and the inner plenum so as to avoid pushing the second gas into the inner plenum before the second gas is equalized. The second gas received into the application plenum 635 flows into the inner plenum through a plurality of conduits 520 defined between the edge plenum 220 and the inner plenum 210. The location, size of the conduits 520 and the number of the conduits 520 ensure that the second gas is received at an outer edge of the inner plenum with sufficient flow and at about the same time as the first gas is supplied and equalized at the inner plenum. A location, a size and a number of second inlets 630, the number of third set of inlets 630a, and the number of conduits 520 are defined to ensure that the time taken to, (a) equalize the second gas within the distribution plenum 625, and (b) apply to the inner plenum via the application plenum, is about the same as the time taken for the first gas applied to the inner plenum to get equalized. This would allow for an effective radial adjustment of the two plenums within the inner plenum.

In some implementations, a number of the third set of second inlets to the application plenum 635 is greater than the number of second inlets 630 that supply the second gas to the distribution plenum 625. This is to ensure that the second gas is supplied to the inner plenum in a fast and efficient manner and to avoid uneven application of the second gas into the inner plenum that can eventually affect how the effective radii of the two gases are controlled. For example, the uneven distribution may occur when one or very few second inlets 630 are unevenly distributed in the showerhead or when the location of the third set of inlets 630a line up with the conduits 520 such that the second gas supplied to the distribution plenum 625 flood the inner plenum at select one or few locations, prior to getting equalized at the distribution plenum, while the remaining locations of the inner plenum do not receive the second gas at all. In some implementations, 4 or 8 or more number of second inlets 630 to the distribution plenum 625 are defined along the periphery region of the showerhead and 8 or 12 or more number of third set of inlets 630a are provided at the interface between the distribution plenum 625 and the application plenum 635. It should be noted that the number of different inlets and outlets has been given as mere examples and should not be considered restrictive.

In some implementations, the second gas flow valves are disposed over the showerhead 160 and outside of the process chamber. The benefit of having the second gas flow valves outside of the process chamber is that when the second gas flow valves are turned on via the controller, the second gas is delivered to the edge plenum at substantially same time. In some implementations, the second gas flow valves are arranged along the periphery region just about the plurality of second inlets. In alternate implementations, the second gas flow valves may be disposed inside the showerhead. The second gas flowing out of the application plenum 635 creates a perimeter flow with the second gas flowing away from the outer edge of the inner plenum toward the center of the showerhead so as to meet the inner flow of the first gas at an outer edge of the first radius. The flow of the first gas or the second gas is controlled to cause the perimeter flow of the second gas to control progress of the inner flow of the first gas or vice versa. The point where the inner flow and the perimeter flow interface is defined by a stagnation point where some amount of the first gas mixes with the second gas while keeping the first and second gases sufficiently separated within the inner plenum. In some implementations, a distance between two consecutive second inlets 630 and two consecutive third inlets 630a are defined such that the flow of the second gas sufficiently covers the treatment region. For example, in one implementation, in order to define a process window of 10 mm for treating the edge of the substrate of equivalent size, the second inlets 630 could be defined 10 mm apart around the periphery of the showerhead while the third set of inlets could be defined 5 mm around the periphery of the showerhead. In some implementations, the third set of inlets could be defined around the periphery in multiple rows with the third set of inlets in each row being offset from the corresponding ones in the other rows. Alternately, the third set of inlets in each row may be in line with the corresponding ones in the other rows.

In some implementations, the controller may be configured to send signals to selective ones of the second gas flow valve(s) or to all the second gas flow valves to control the flow of the second gas applied to the distribution plenum. For instance, if the radial width of the second gas needs to be decreased, only a portion of the second inlets may be used to apply the second gas to reduce the flow rate of the second gas applied to the edge plenum. Accordingly, the controller may provide signals to the second gas flow valve(s) to supply the second gas through selective ones (e.g., every alternative ones or ever third one, etc.,) of the second inlets 630. Alternately, all of the second inlets 630 may be used with the signal from the controller to the second gas flow valve(s) to adjust the flow of the second gas through all of the second inlets.

FIGS. 6A-6C illustrate overhead views of the radii of the first and second gases within the inner plenum of the showerhead, in some implementations. The first gas being applied from the center of the showerhead creates an inner flow that flows outwardly from the center of the showerhead toward the peripheral region of the inner plenum. The second gas is supplied to an outer edge of the inner plenum through a set of second inlets defined along the peripheral portion of the showerhead. The second gas flow creates a perimeter flow that flows from the peripheral region toward the center and meets the inner flow of the first gas at a stagnation point 530. As illustrated in FIG. 6A, the first gas extends a first radius 'r1'. The second gas extends from an outer edge of the first radius r1 to a second radius 'r2' to define a width 'd1' of the second gas, which is determined to be the difference between r2 and r1. In FIG. 6B, the first gas extends a first radius r1' and the second gas extends from an outer edge of the first radius r1' to a second radius r2' to define a width 'd2' of the second gas, which is computed as the difference between r2' and r1'. Similarly, in FIG. 6C, the first gas extends a first radius r1", the second gas extends from an outer edge of the first radius r1" to a second gas radius r2" to define the width 'd3' of the second gas, which is computed as the difference between r2" and r1". From FIGS. 6A-6C it can easily be deduced that the width d2 is greater than d1 and width d3 is greater than d2 and d1. Dynamically adjusting the flow of the two gas plenums within the inner plenum correspondingly adjusts the radial width of the two plenums, which affects the different regions on the substrate surface.

The various implementations of the showerhead enable radial control of the different gases that are supplied through the showerhead to the top surface of the substrate. The showerhead allows an effective way to dynamically regulate the flow of the different gases so as to define different process windows for the various gases applied to the substrate surface and such regulation can be carried out without having to swap the showerhead. It should be noted herein that the various implementations have been discussed with reference to providing two different process windows. The embodiments may be extended to provide more than two different process windows by adding additional conduits in the showerhead to define additional plenums of different gases within the inner plenum. Various advantages will become apparent to one skilled in the art upon reading the specification.

Figure 7:
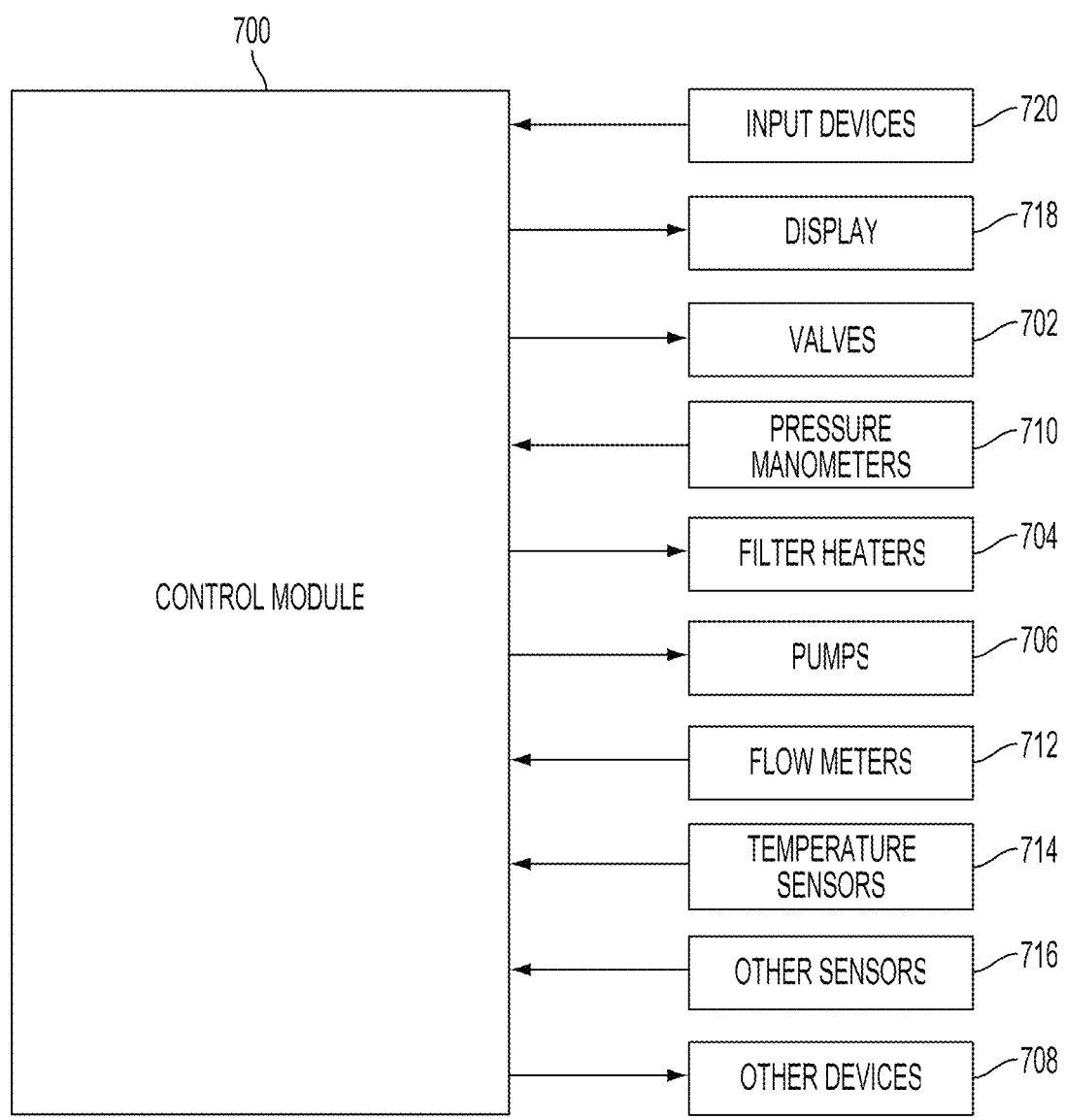
FIG. 7 shows an example control module for controlling the various aspects, including process recipes and hardware of the substrate processing system, in accordance with one implementation.

FIG. 7 shows a control module 700 (similar to control module 110 of FIG. 1) for controlling the systems described above. In one embodiment, the control module 110 of FIG. 1 may include some of the example components. For instance, the control module 700 may include a processor, memory and one or more interfaces. The control module 700 may be employed to control devices in the system based in part on sensed values. For example only, the control module 700 may control one or more of valves 702, filter heaters 704, pumps 706, and other devices 708 based on the sensed values and other control parameters. The control module 700 receives the sensed values from, for example only, pressure manometers 710, flow meters 712, temperature sensors 714, and/or other sensors 716. The control module 700 may also be employed to control process conditions during precursor delivery and deposition of the film. The control module 700 will typically include one or more memory devices and one or more processors.

The control module 700 may control activities of the precursor delivery system and deposition apparatus. The control module 700 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 700 may also monitor the pressure differential and automatically switch vapor precursor delivery from one or more paths to one or more other paths. Other computer programs stored on memory devices associated with the control module 700 may be employed in some embodiments.

Typically there will be a user interface associated with the control module 700. The user interface may include a display 718 (e.g. a display screen and/or graphical software displays of the apparatus and/or process conditions), and user input devices 720 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 710, and thermocouples located in delivery system, the pedestal or chuck (e.g. the temperature sensors 714). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A process chamber used for processing a substrate, comprising:
    a lower chamber body having a substrate support surface for supporting the substrate;
    an upper chamber body configured to mate over the lower chamber body, the upper chamber body including a showerhead, wherein the showerhead includes,
        an inner plenum coupled to a single first inlet, the single first inlet oriented at a center of the showerhead and configured to supply a first gas from a first source into a center region of the inner plenum to create an inner flow of the first gas that moves radially out from the center region toward an outer edge of the inner plenum, a first flow valve coupled to the single first inlet to control a first flow rate of the first gas to set the inner flow to extend to a first radius;
        an edge plenum located along a peripheral region of the showerhead, the edge plenum having a plurality of second inlets that receive a second gas from a second source;
        a plurality of conduits couple the edge plenum to the inner plenum at the outer edge of the inner plenum, the plurality of conduits supply the second gas from the edge plenum and into the inner plenum so as to create a perimeter flow of the second gas in the inner plenum that flows inward from the outer edge of the inner plenum toward the center region,
        wherein a second flow valve is coupled to the plurality of second inlets to control a second flow rate of the second gas supplied to the inner plenum via the edge plenum to set the perimeter flow of the second gas to extend from an edge of the first radius to a second radius in the inner plenum, the second flow rate of the second gas is different from the first flow rate of the first gas supplied simultaneously in the inner plenum to form a stagnation point at the first radius of the inner plenum that acts as a separation interface, the first flow rate controlled by the first flow valve and the second flow rate controlled by the second flow valve are set to dynamically adjust the first radius while keeping the first gas substantially separate from the second gas; and
    a plurality of outlets distributed across a lower surface that extends a diameter of the inner plenum, the plurality of outlets configured to separately and simultaneously deliver the first gas from the inner plenum to a first process region and the second gas from the inner plenum to a second process region defined over the substrate support surface.

2. The process chamber of claim 1, wherein the inner flow defines a first process window and the perimeter flow defines a second process window within the showerhead, sizes of the first process window and the second process window dynamically adjusted by controlling the first flow rate and the second flow rate using the first and the second flow valves.

3. The process chamber of claim 1, wherein the diameter of the inner plenum in the showerhead is defined to cover over an area equal to at least a diameter of the substrate, when the substrate is received in the process chamber, such that the first process region covers an area defined over a central region of the substrate and the second process region covers an area defined over an edge region of the substrate.

4. The process chamber of claim 1, wherein the single first inlet is coupled to the first source via the first flow valve, and the plurality of second inlets is connected to a central channel defined in the showerhead, wherein the central channel surrounds the single first inlet and is coupled to the second source via the second flow valve.

5. The process chamber of claim 1, wherein the first flow valve and the second flow valve are coupled to a controller, the controller is configured to independently provide the first signal to the first flow valve to adjust the inner flow of the first gas into the inner plenum and the second signal to the second flow valve to adjust the peripheral flow of the second gas from the edge plenum to the outer edge of the inner plenum.

6. The process chamber of claim 1, wherein the single first inlet is coupled to the first source via the first flow valve, and
wherein each one of the plurality of second inlets is coupled to the second source via a separate second flow valve located above the corresponding second inlet of the plurality of second inlets,
the first flow valve and each one of a plurality of second flow valves are individually coupled to a controller, wherein the controller is configured to provide the first signal to the first flow valve to adjust the inner flow of the first gas into the inner plenum and the second signal to each one of the plurality of second flow valves to adjust the perimeter flow of the second gas from the edge plenum into the outer edge of the inner plenum.

7. The process chamber of claim 1, further includes,
a controller;
the first flow valve connected to the single first inlet, the first source and to the controller, the controller configured to provide a signal to the first flow valve to adjust the inner flow of the first gas through the single first inlet into the inner plenum; and
the second flow valve connected to the plurality of second inlets, the second source and to the controller, the controller configured to provide signal to the second flow valve to adjust the perimeter flow of the second gas through the plurality of second inlets from the edge plenum into the outer edge of the inner plenum,
wherein the first flow valve and the second flow valve are located outside of the showerhead.

8. The process chamber of claim 7, wherein the controller is configured to selectively provide (a) only the first signal to the first flow valve to adjust the inner flow of the first gas into the inner plenum, or (b) only the second signal to the second flow valve to adjust the perimeter flow of the second gas into the inner plenum, or (c) both the first and the second signals to the first and the second flow valves so as to adjust the inner flow of the first gas into the inner plenum and the perimeter flow of the second gas from the edge plenum into the outer edge of the inner plenum, wherein the adjustment of the flow of the first gas or the second gas causes corresponding adjustment to sizes of the first and the second process regions.

9. The process chamber of claim 1, wherein the first flow valve is coupled to the single first inlet, the first source and to a controller, the controller configured to provide the first signal to the first flow valve to control flow of the first gas into the inner plenum through the single first inlet, so as to dynamically cause a first adjustment that corresponds to an adjustable radius of the stagnation point defined within the inner plenum and a second adjustment that corresponds to sizes of the first and the second process regions.

10. The process chamber of claim 1, wherein the edge plenum further includes,
a distribution plenum having the plurality of second inlets to receive and equalize the second gas provided by the second source; and
an application plenum having a set of third inlets to receive the second gas from the distribution plenum and supply the second gas through the plurality of conduits to an outer edge of the inner plenum.

11. The process chamber of claim 1, wherein a number of the plurality of second inlets in the edge plenum is less than a number of the plurality of conduits coupling the edge plenum to the inner plenum.

12. A showerhead of a substrate processing system used for processing a substrate, comprising:
an inner plenum coupled to a single first inlet, the single first inlet oriented at a center of the showerhead and configured to supply a first gas from a first source into a center region of the inner plenum to create an inner flow of the first gas that moves radially out from the center region toward an outer edge of the inner plenum, a first flow valve coupled to the single first inlet to control a first flow rate of the first gas to set the inner flow to extend to a first radius;
an edge plenum located along a peripheral region of the showerhead, the edge plenum having a plurality of second inlets that receive a second gas from a second source;
a plurality of conduits couple the edge plenum to the inner plenum at the outer edge of the inner plenum, the plurality of conduits supply the second gas from the edge plenum and into the inner plenum so as to create a perimeter flow of the second gas in the inner plenum that flows inward from the outer edge of the inner plenum toward the center region,
wherein a second flow valve is coupled to the plurality of second inlets to control a second flow rate of the second gas supplied to the inner plenum via the edge plenum to set the perimeter flow of the second gas to extend from an edge of the first radius to a second radius in the inner plenum, the second flow rate of the second gas is different from the first flow rate of the first gas supplied simultaneously in the inner plenum to form a stagnation point at the first radius of the inner plenum that acts as a separation interface, the first flow rate controlled by the first flow valve and the second flow rate controlled by the second flow valve are set to dynamically adjust the first radius while keeping the first gas substantially separate from the second gas; and
a plurality of outlets distributed across a lower surface that extends a diameter of the inner plenum, the plurality of outlets configured to separately and simultaneously deliver the first gas from the inner plenum to a first process region and the second gas from the inner plenum to a second process region defined over a substrate, when the substrate is present in the substrate processing system.

13. The showerhead of claim 12, wherein the single first inlet is connected to the first source via the first flow valve, the first flow valve coupled to a controller, wherein the controller is configured to provide a first signal to the first flow valve to adjust a flow of the first gas through the single first inlet into the inner plenum; and each of the plurality of second inlets is connected to the second source via the second flow valve, the second flow valve coupled to the controller, the controller configured to provide a second signal to the second flow valve to adjust a flow of the second gas through each of the plurality of second inlets into the edge plenum.

14. The showerhead of claim 12, wherein the first flow valve and the second flow valve are located outside the showerhead.

15. The showerhead of claim 12, wherein the first flow valve and the second flow valve are located inside the showerhead.

16. The showerhead of claim 12, wherein the plurality of second inlets are distributed along a peripheral region of the showerhead, each of the plurality of second inlets is connected to the second source through a central channel, wherein the central channel is defined to surround the single first inlet.

17. The showerhead of claim 12, wherein the showerhead is part of an upper chamber body of a process chamber that is part of the substrate processing system, the upper chamber body is configured to mate with a lower chamber body of the process chamber, wherein the lower chamber body includes a substrate support surface for supporting the substrate, when received for processing.

* * * * *